United States Patent [19]
Oomura

[11] Patent Number: 5,668,672
[45] Date of Patent: Sep. 16, 1997

[54] CATADIOPTRIC SYSTEM AND EXPOSURE APPARATUS HAVING THE SAME

[75] Inventor: Yasuhiro Oomura, Oota-ku, Japan

[73] Assignee: Nikon Corporation, Japan

[21] Appl. No.: 570,922

[22] Filed: Dec. 12, 1995

[30] Foreign Application Priority Data

Dec. 16, 1994 [JP] Japan ................................ 6-313354

[51] Int. Cl.$^6$ ................................................ G02B 17/00
[52] U.S. Cl. ............................ 359/727; 359/732; 359/736
[58] Field of Search ............................ 359/630–633, 359/727, 729, 732, 733–736

[56] References Cited

U.S. PATENT DOCUMENTS

| | | |
|---|---|---|
| 5,089,913 | 2/1992 | Singh et al. |
| 5,220,454 | 6/1993 | Ishihara ................ 359/487 |
| 5,241,423 | 8/1993 | Chiu et al. |
| 5,289,312 | 2/1994 | Hashimoto ............. 359/487 |
| 5,402,267 | 3/1995 | Fürter .................... 359/727 |
| 5,530,586 | 6/1996 | Yasugaki ............... 359/364 |

FOREIGN PATENT DOCUMENTS

| | | |
|---|---|---|
| 0 608 572 A2 | 8/1994 | European Pat. Off. |
| 34 47 489 A1 | 7/1985 | Germany. |
| 44 17 489 A1 | 11/1995 | Germany. |
| 2-66 510 A | 3/1990 | Japan. |
| 2-66510 | 3/1990 | Japan. |
| 3-282527 | 12/1991 | Japan. |
| 4-2 35 526 A | 8/1992 | Japan. |
| 5-72 478 A | 3/1993 | Japan. |
| 5-72478 | 3/1993 | Japan. |
| 5-88087 | 4/1993 | Japan. |
| 5-88088 | 4/1993 | Japan. |
| 5-88089 | 4/1993 | Japan. |
| 5-88090 | 4/1993 | Japan. |
| WO95/32446 | 11/1995 | WIPO. |

Primary Examiner—Georgia Y. Epps
Assistant Examiner—John P. Cornely
Attorney, Agent, or Firm—Pennie & Edmonds LLP

[57] ABSTRACT

This invention relates to a catadioptric optical system in which, a large numerical aperture is attained on the image side and, while securing a sufficient working distance, the size of the beam splitter is reduced, thereby attaining a resolution of a quarter micron unit, and an exposure apparatus using the same. In order to form a reduced image of a pattern of a first surface on a second surface, this catadioptric optical system comprises, at least, a first lens group, a beam splitter, a concave mirror having an enlarging magnification, and a second lens group. These constitutional elements of the catadioptric optical system are disposed such that light from the first surface passes through the first lens group, the beam splitter, the concave mirror, the beam splitter, and the second lens group in this order. In particular, the rear-side principal plane of the second lens group is on the second surface side with respect to a light-entering surface of the second lens group on which the light having passed through the beam splitter is incident. In addition, the concave mirror functions to collimate the light having passed through the beam splitter and then make thus collimated light re-enter the beam splitter.

24 Claims, 11 Drawing Sheets

EXPOSURE AREA

CATADIOPTRIC SYSTEM AND EXPOSURE APPARATUS HAVING THE SAME

BACKGROUND OF THE INVENTION

1. Field of the Invention

The present invention relates to a catadioptric reduction optical system which is suitably applied to a projection optical system for reductive projection in a projection exposure apparatus used, for example, when a semiconductor device, a liquid crystal display device, or the like is made by a photolithography process. In particular, it relates to a catadioptric reduction optical system having a resolution of a quarter micron unit in the ultraviolet wavelength region due to the use of a reflection system as an element thereof and an exposure apparatus using the same.

2. Related Background Art

In a photolithography process for making semiconductor device or the like, there is used a projection exposure apparatus in which a pattern image of a photomask or reticle (collectively referred to as "reticle" in the following) is reduced to about ¼ to ⅕ by way of a projection optical system and then thus reduced pattern image is projected on a wafer (or glass plate, for example) coated with a photoresist or the like. As the integration of the semiconductor devices and the like is improved, there has been a demand for a higher resolution in the projection optical system used in the projection exposure apparatus. In order to satisfy such a demand, there have been occurred necessities for shortening the wavelength of illumination light and increasing the numerical aperture (N.A.) of the projection optical system.

However, as the wavelength of the illumination light becomes shorter, a fewer kinds of glass materials can be practically used due to the light absorption. Specifically, when the wavelength of the illumination light is 300 nm or less, only synthetic quartz and fluorite can be listed as practically usable glass materials. Accordingly, when the projection optical system is constructed by a refraction system alone, it becomes difficult for various aberrations such as chromatic aberration to be corrected. On the other hand, when the projection optical system is constructed by a catoptric system alone, there is no chromatic aberration. Therefore, there has been proposed a technique in which a reduction projection optical system is constructed by a so-called catadioptric optical system which combines a catoptric system and a dioptric system together.

A catadioptric reduction optical system having a beam splitter for changing optical paths in order to input and output a luminous flux with respect to a catoptric system is disclosed, for example, in Japanese Unexamined Patent Publication Hei No. 2-66510, No. 4-235516, and No. 5-72478. All the concave mirrors included in the catadioptric reduction optical systems disclosed in the above-mentioned publications are convergent mirrors having a reductive magnification.

SUMMARY OF THE INVENTION

The inventors have studied the conventional catadioptric reduction optical system and found the following problems.

Namely, in the conventional catadioptric reduction optical system, since the concave mirror has a reductive magnification, the imaging magnification of a lens group disposed at an optical path on the image side with respect to the concave mirror is made large. Accordingly, in the conventional catadioptric reduction optical system, when a larger numerical aperture is to be attained on the image side, the aperture of the beam splitter has to be enlarged substantially in proportion to the imaging magnification of the above-mentioned lens group. It results in difficulty in manufacture as well as increase of manufacturing cost. Also, since the conventional catadioptric reduction optical system has a concave mirror with a reductive magnification, the distance between the beam splitter and the image surface becomes short. As a result, it is difficult for the working distance on the image side to be sufficiently secured. Also, in this case, the image-forming characteristic cannot be prevented from deteriorating due to different incident angles of individual light beams in the luminous flux incident on the direction change surface of the beam splitter.

Accordingly, an object of the present invention is to provide a catadioptric optical system in which, a large numerical aperture is attained on the image side and a sufficient working distance on the image side is secured, while the size of the beam splitter can be reduced, and which has a resolution of a quarter micron unit.

Another object of the present invention is to provide an exposure apparatus using such a catadioptric optical system.

The catadioptric optical system in accordance with the present invention is applicable to any of one-shot exposure type exposure apparatuses and scanning type exposure apparatuses. The exposure apparatus to which this catadioptric optical system is applied has, at least, a first stage (i.e., wafer stage) allowing a photosensitive substrate (e.g., silicon wafer or the like whose surface is coated with a photoresist) to be held on a main surface thereof, a second stage (i.e., reticle stage) for holding a mask (e.g., reticle) having a predetermined pattern, and an illumination optical system for illuminating the above-mentioned mask with exposure light having a predetermined wavelength so as to transfer an image of the pattern of the mask to the above-mentioned substrate. The catadioptric optical system in accordance with the present invention is disposed between the object surface (i.e., the first surface) on the mask and the image surface (i.e., the second surface) on the substrate and projects, upon the second surface on the substrate, a reduced image of the pattern of the mask on the first surface.

For example, as shown in FIG. 3, the catadioptric optical system in accordance with the present invention comprises a beam splitter BS having a direction change surface $BS_a$ by which the traveling direction of light input from a predetermined direction is changed; a first lens group $G_1$ guiding light from the first surface P1 to the beam splitter BS; a collimator for collimating at least light which has passed through the first lens group $G_1$ and whose traveling direction is to be changed by the direction change surface $BS_a$ of the beam splitter BS and guiding thus collimated light to the beam splitter BS; and a second lens group $G_2$ for guiding, to the second surface P2, the light whose traveling direction has been changed by the direction change surface $BS_a$ of the beam splitter BS and which has been output from an output surface $BS_b$ of the beam splitter BS facing the second lens group $G_2$.

The above-mentioned collimator may be disposed at a position which opposes to the first lens group $G_1$ through the beam splitter BS (i.e., the first arrangement) or in an optical path between the first lens group $G_1$ and the beam splitter BS (i.e., the second arrangement). In particular, in the case of the first arrangement, the collimator includes a reflecting mirror. In the embodiments in this specification, a concave mirror M having an enlarging magnification is used as the reflecting mirror.

In addition, in the catadioptric optical system in accordance with the present invention, as shown in FIG. 4, the position of the rear-side principal point of the second lens group $G_2$ (which is on the rear-side principal plane $G_{2b}$) is positioned on the side of the second surface P2 with respect to the light-entering surface $G_{2a}$ of the second lens group $G_2$ on which the light component which has passed through the beam splitter BS is incident. Here, in this drawing, $f_2$ indicates the focal length of the second lens group $G_2$, whereas $L_1$ indicates the distance between the rear-side principal plane $G_{2b}$, and the light-entering surface $G_{2a}$. By contrast, the rear-side principal point position and the light-entering surface $G_{2a}$ in the conventional catadioptric optical system are in reverse with respect to those in the catadioptric optical system in accordance with the present invention.

Since the catadioptric optical system in accordance with the present invention is constructed such that the rear-side principal point position and the light-entering surface $G_{2a}$ are in reverse with respect to those in the conventional catadioptric optical system, the following technical advantages are obtained. Namely, the size of the beam splitter BS can be reduced while realizing a large numerical aperture; aberrations can be sufficiently corrected so as to attain a resolution of a quarter micron unit while realizing a large numerical aperture; and the working distance on the side of the substrate W can be increased so as to enable slit-scan type exposure.

Next, the catadioptric optical system in accordance with the present invention may be constructed so as to satisfy the following conditions:

$$-1 < 1/\beta_M < 0.5 \quad (1)$$

$$0.85 < L_1/f_2 \quad (2)$$

wherein $\beta_M$ is the imaging magnification of the concave mirror M, $L_1$ is the distance between the rear-side principal plane $G_{2b}$ and the light-entering surface $G_{2a}$, and $f_2$ is the focal length of the second lens group $G_2$.

As described in the foregoing, in the catadioptric optical system in accordance with the present invention, since the concave mirror M has an enlarging magnification, the second lens group $G_2$ can have a high positive refracting power. According to this configuration, without increasing the size of the beam splitter BS, a large numerical aperture can be attained on the image side while securing a sufficient movable distance.

Also, the collimator in the present invention functions to decrease the angular difference between incident angles, with respect to the direction change surface $BS_a$ of the beam splitter BS, of individual light beams in the luminous flux whose traveling direction should be changed by the direction change surface $BS_a$.

On the other hand, condition (1) defines a preferable range of imaging magnification for the concave mirror M. Below the lower limit of this condition, it is difficult for the second lens group $G_2$ to have a high positive refracting power. As a result, the size of the beam splitter BS, by itself, has to be increased in order to attain a large numerical aperture on the image side. Under such a condition, the manufacture of the beam splitter BS becomes further difficult while incurring a higher manufacturing cost. Also, under this condition, the distance between the beam splitter BS and the image surface P2 cannot be sufficiently secured and thereby it becomes difficult for the optical system to secure a sufficient working distance. Further, under this condition, since the luminous flux directed toward the direction change surface $BS_a$ of the beam splitter BS from the concave mirror M becomes a convergent luminous flux, fluctuation in the incident angles, with respect to the direction change surface $BS_a$, of the light beams in this luminous flux increases, thereby deteriorating the image-forming characteristic of the optical system. Preferably, the lower limit of condition (1) is set to –0.8 as $-0.8 < 1/\beta_M$.

Also, above the upper limit of condition (1), the positive refracting index carried by the convex mirror M decreases. As a result, it becomes difficult for aberrations to be corrected. Also, in order to favorably correct aberrations, it is preferable that the upper limit of condition (1) is set to 0.2 as $1/\beta_M < 0.2$.

Condition (2) defines a preferable configuration of the second lens group $G_2$. Here, under the condition where the second lens group $G_2$ does not satisfy condition (2), i.e., below the lower limit of condition (2), the diameter of the beam splitter BS has to become large and also it becomes difficult for the working distance on the image side to be practically secured at a sufficient level. Here, the upper limit of condition (2) is preferably set to 6.0 as $L_1/f_2 < 6.0$. Above this upper limit, when a larger numerical aperture is to be obtained, it becomes difficult for aberrations to be corrected and also the total length of the optical system has to become inappropriately long. The optical system under such a condition is inappropriate as a projection optical system used in an apparatus for making semiconductors. Further, in the present invention, in order to obtain a large numerical aperture and to reduce the size of the beam splitter BS, the lower limit of condition (2) is preferably set to 1.35 as $1.35 < L_1/f_2$.

The beam splitter BS in the present invention is preferably a polarizing beam splitter which separates light components according to their polarizing directions. In this case, a $\lambda/4$ plate is disposed in an optical path between the beam splitter BS and the concave mirror M.

Also, when the imaging magnification of the catadioptric optical system in accordance with the present invention, as a whole, is $\beta$, the imaging magnification $\beta_2$ of the second lens group $G_2$ preferably satisfies the following condition:

$$-1 < \beta_2/\beta < 1 \quad (3)$$

Condition (3) defines a preferable range of the imaging magnification of the second lens group $G_2$. Below the lower limit of condition (3), the condition is unfavorable in that a large numerical aperture cannot be obtained without increasing the aperture of the beam splitter BS. Also, above the upper limit of condition (3), it is unfavorable in that the refracting power carried by the refractive optical elements (e.g., the first lens group $G_1$ and the second lens group $G_2$) in the catadioptric optical system of the present invention becomes too high, namely, the influence of the reflective optical element (i.e., concave mirror M) on the catadioptric optical system becomes small, thereby making it difficult for aberrations to be corrected.

In the present invention, the beam splitter BS is preferably a prism type beam splitter. In the catadioptric optical system of the present invention, the prism type beam splitter functions to reduce loss in quantity of light, as compared with the case where a half mirror is used, and to prevent unfavorable light such as flare from generating. Also, as compared with the case where a zonal exposure area or the like is used to divide an optical path, since the light source on the optical axis can be utilized, the prism type beam splitter advantageously corrects aberrations, thereby enabling the optical system to reduce its size. Further, an aperture stop AS is preferably disposed on the image side including the output surface $BS_b$ of the prism type beam splitter. Here, the aperture stop AS is preferably disposed so as to satisfy the following condition:

$$0.26 < D_1/f_M < 1.00 \tag{4}$$

wherein $D_1$ is the air-converted distance between the concave mirror M and the aperture stop AS and $f_M$ is the focal length of the concave mirror M.

Here, the air-converted distance refers to a reduced distance defined as the sum of the ratios of the lengths, in the optical path direction, of the media disposed in the optical path (i.e., thickness values of the respective media) to their refractive indexes. In particular, assuming that the length of the individual medium in the optical path direction is di and the refractive index of the individual medium is ni, the air-converted distance dt is represented by the following expression:

$$dt = \sum_i \frac{di}{ni}$$

Condition (4) defines a preferable range for the position of the aperture stop AS. Below the lower limit of this condition, the aperture stop AS is too close to the concave mirror M or the focal length of the concave mirror M is too long. As a result, it becomes difficult for the beam splitter BS to reduce its size. Also, it becomes difficult for the fluctuation of the incident angles (i.e. angular difference) of the light beams incident on the direction change surface $BS_a$ to be reduced. Here, below the lower limit of condition (4), even when the catadioptric optical system in accordance with the present invention satisfies the above-mentioned conditions (1) to (3), a practically sufficient working distance cannot be obtained on the image side and, in addition, it becomes impossible for the aperture stop AS to be disposed in the manufacture thereof. On the other hand, above the upper limit of conditional (4), aberrations of the luminous flux outside of the axis such as coma, in particular, cannot be corrected.

Also, assuming that the air-converted distance between the output surface $BS_b$ of the beam splitter facing the second lens group $G_2$ and the second surface W is $D_2$, the focal length of the second lens group $G_2$ is $f_2$, and the numerical aperture of the catadioptric optical system on the side of the second surface W is NA, the catadioptric optical system in accordance with the present invention preferably satisfies the following condition:

$$D_2 \cdot NA/f_2 > 0.70 \tag{5}$$

Condition (5) defines a preferable distance between the beam splitter BS and the image surface P2. When condition (5) is not satisfied, the space for disposing the second lens group $G_2$ becomes too small to secure a practically sufficient working distance on the image side. In this case, the number of the refractive optical elements constituting the second lens group $G_2$ is limited, thereby making it difficult for aberrations to be corrected. Also, when condition (5) is not satisfied, it becomes difficult for the second lens group $G_2$ to be configured so as to satisfy the above-mentioned condition (3). In order to attain a large numerical aperture on the image side and reduce the size of the beam splitter, while securing a sufficient working distance on the image side, the upper limit in condition (5) is set to 1.0 as $D_2 \cdot NA/f_2 < 1.0$.

Also, the present invention is preferably configured so as to satisfy the following condition:

$$(\Phi_B^{1/2} - 4d_W \cdot NA)/\{f_2 \cdot (NA)^2\} < 4 \tag{6}$$

wherein $\Phi_B$ is the area of orthogonal projection of the direction change surface $BS_a$ of the beam splitter BS on the output surface $BS_b$, facing the second lens group $G_2$, $d_W$ is the working distance of the catadioptric optical system on the side of the second surface, NA is the numerical aperture of the catadioptric optical system on the side of the second surface, and $f_2$ is the focal length of the second lens group $G_2$.

Condition (6) defines a preferable range of the focal length of the second lens group $G_2$ with respect to the numerical aperture on the image side, the working distance on the image side, and the aperture of the beam splitter. When condition (6) is not satisfied, it becomes difficult for the optical system to be manufactured. Also, when a thin film is disposed on the direction change surface $BS_a$ of the beam splitter BS or a λ/4 plate is provided with the beam splitter BS in cases where condition (6) is not satisfied, the amount of wave aberration generated here becomes noticeable, thereby resulting in a remarkable deterioration. In order to facilitate manufacture of the optical system and improve its image-forming characteristic, the upper limit of condition (6) is set to 3.5 as $(\Phi_B^{1/2} - 4d_W \cdot NA)/\{f_2 \cdot (NA)^2\} < 3.5$.

In order to correct chromatic aberration while attaining a resolution of a quarter micron unit using light having a wavelength of 300 nm or less, it is preferable that each of the refractive elements constituting each of the first lens group $G_1$ and the second lens group $G_2$ comprises one of at least two different kinds of materials. Preferably, the first lens group $G_1$ has at least a negative lens component of fluorite while the second lens group $G_2$ has at least a positive lens component of fluorite.

In this case, magnification chromatic aberration is corrected by the first lens group $G_1$ having the negative lens component made of fluorite, while axial chromatic aberration is corrected by the second lens group $G_2$ having the negative lens component made of fluorite. Also, since the magnification of the catadioptric optical system in accordance with the present invention is configured so as to satisfy the above-mentioned condition (1), a sufficient space is secured for the second lens group $G_2$ which is to be disposed between the beam splitter BS and the second surface P2. Accordingly, the refractive elements in the lens groups $G_1$ and $G_2$ are configured as mentioned above, thereby enabling the catadioptric optical system to correct chromatic aberration while attaining a resolution of a quarter micron unit using light having a wavelength of 300 nm or less.

In the present invention, the luminous flux between the beam splitter BS and the second lens group $G_2$ is preferably an afocal luminous flux.

Also, the present invention encompasses a configuration in which a lens group for correcting aberrations is disposed between the beam splitter BS and the concave mirror M.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the following, embodiments of the catadioptric optical system in accordance with the present invention will be explained with reference to FIGS. 1 to 11. This catadioptric optical system is applicable to any of one-shot exposure type exposure apparatuses and scanning type exposure apparatuses.

Figure 1:
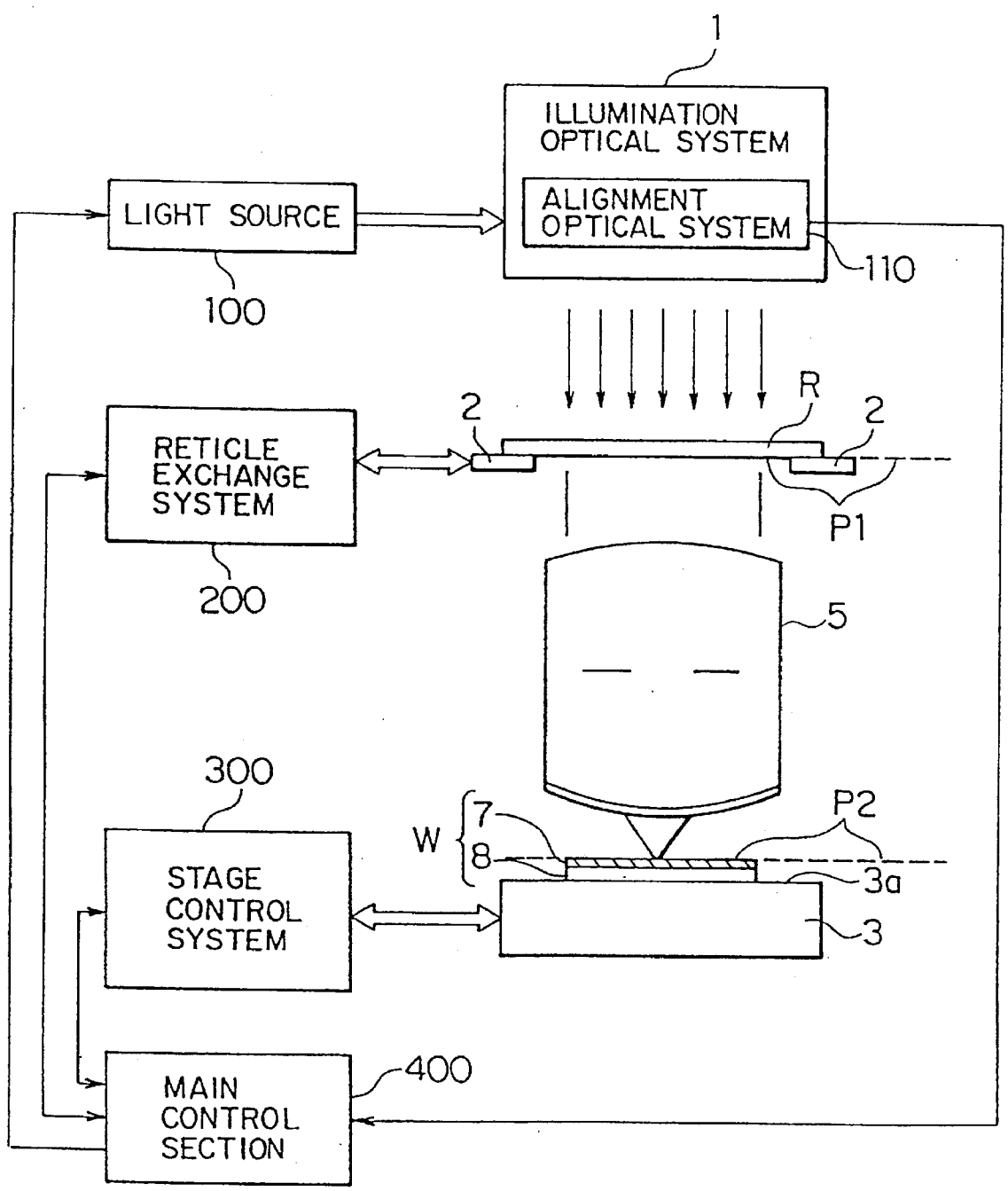
FIG. 1 is a view showing a configuration of a one-shot exposure type exposure apparatus to which the catadioptric optical system in accordance with the present invention is applicable.

FIG. 1 is a view showing a configuration of an exposure apparatus using a one-shot exposure method. In this drawing, the exposure apparatus comprises a wafer stage 3 (i.e., the first stage) which is a movable stage in which a photosensitive substrate W can be held on a main surface 3a thereof; a reticle stage 2 (i.e., the second stage) which is a movable stage for holding a reticle R; a light source 100 for emitting exposure light having a predetermined wavelength; and an illumination optical system 1 for illuminating the reticle R with the exposure light from the light source 100 so as to transfer an image of a predetermined pattern of an electronic circuit or the like on the reticle R to the above-mentioned substrate W. Here, the above-mentioned photosensitive substrate W comprises, for example, an exposure object 8 such as a silicon wafer or a glass plate whose surface is coated with a photosensitive material 7 such as a photoresist. Also, the above-mentioned illumination optical system 1 has an alignment optical system 110 for positioning the reticle R and the photosensitive substrate W with respect to each other.

Further, this exposure apparatus has a reticle exchange system 200 which changes the reticle R to be held on the reticle stage 2 and moves the latter according to instructions from a main control section 400 and a stage control system 300 for moving the wafer stage 3 according to instructions from the main control system 400. For example, when the main control system 400 obtains amounts of deviation of the stages 2 and 3 from the alignment optical system 110, it calculates amounts of movement of the stages 2 and 3 and output instructions for movement thereto. The stages 2 and 3 move in their respective predetermined directions so as to adjust relative positions of the reticle R and the photosensitive substrate R with respect to each other.

A catadioptric optical system 5 in accordance with the present invention is disposed between the reticle stage 2 and the wafer stage 3, namely, between the first surface P1 (i.e., the object surface) and the second surface P2 (i.e., the image surface) on the photosensitive substrate W, so as to project, upon the substrate W, a reduced image of the predetermined pattern on the reticle R.

Figure 2:
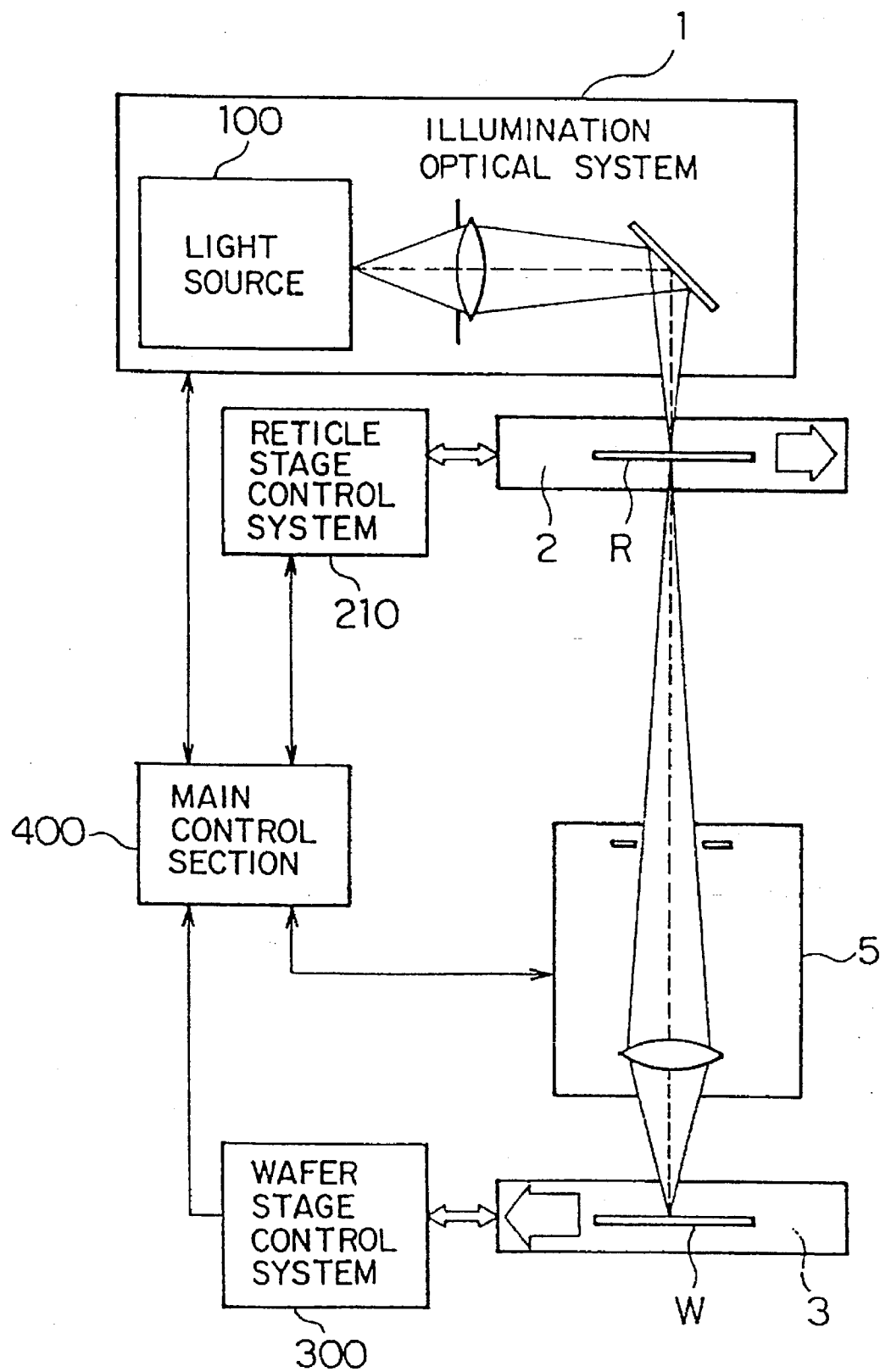
FIG. 2 is a view showing a configuration of a scanning type exposure apparatus to which the catadioptric optical system in accordance with the present invention is applicable.
Figure 5:
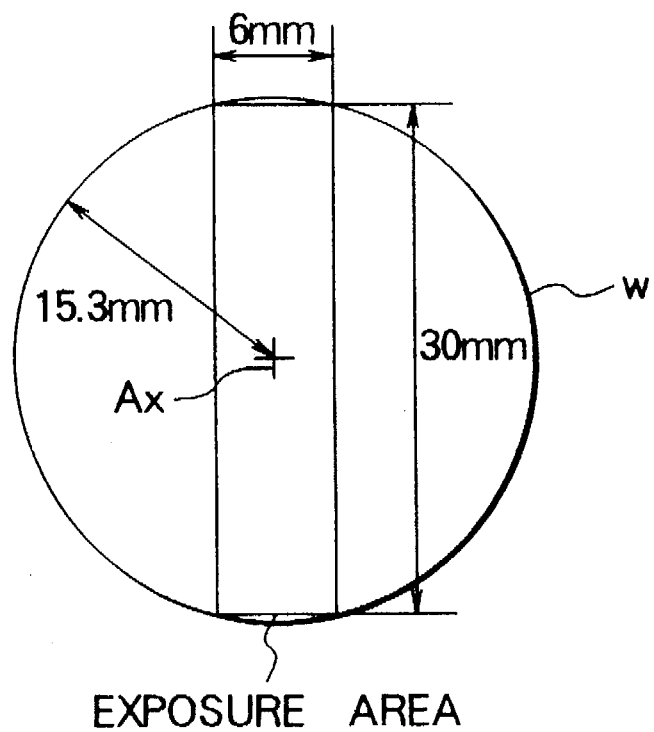
FIG. 5 is a view showing the exposure area of the catadioptric optical system in the first embodiment shown in FIG. 3.

FIG. 2 is a view showing a configuration of a scanning type exposure apparatus to which the catadioptric optical system in accordance with the present invention is applicable. In this drawing, as in the case of the collective exposure apparatus shown in FIG. 1, the exposure apparatus comprises a movable reticle stage 2, a movable wafer stage 3, an illumination optical system 1 (including a light source 100), and a catadioptric optical system 5 in accordance with the present invention. The illumination optical system 1 illuminates a predetermined form of an illumination area on a reticle R with exposure light from the light source 100. The catadioptric optical system 5 projects a reduced image of a pattern in this area upon a substrate W (i.e., photosensitive substrate). FIG. 5 shows an exposure area on the substrate W. A reticle stage control system 210, which can move the reticle stage 2 in a predetermined direction, while holding the reticle R, so as to change the relative position of the reticle R with respect to the substrate w, is included in the above-mentioned reticle exchange system 200. Similarly, a wafer stage control system 300 can move the wafer stage 3 in a predetermined direction, while holding the substrate W, so as to change the relative position of the substrate W with respect to the reticle R. A computer system as a main control section 400 controls the reticle stage control system 210 and the wafer stage control system 300 independently from each other. Accordingly, the exposure apparatus can perform a scanning type exposure method in which the relative positions of the exposure area on the substrate W and the illumination area on the reticle R with respect to each other are changed.

Techniques concerning the above-mentioned types of the exposure apparatuses are disclosed, for example, in U.S.

patent application Ser. Nos. 08/255,927; 08/260,398; and 08/299,305 as well as in U.S. Pat. Nos. 4,497,015; 4,666, 273; 5,194,893; 5,253,110; 5,333,035; and 5,379,091. The catadioptric optical system in accordance with the present invention is applicable to any exposure apparatus disclosed in these literatures.

The above-mentioned U.S. patent application Ser. No. 08/255,927 discloses an illumination optical system (using a laser light source) applicable to a scanning type exposure apparatus. The above-mentioned U.S. patent application Ser. No. 08/260,398 discloses an illumination optical system (using a lamp light source) applicable to a scanning type exposure apparatus. The above-mentioned U.S. patent application Ser. No. 08/299,305 discloses an alignment optical system applicable to a scanning type exposure apparatus. U.S. Pat. No. 4,497,015 discloses an illumination optical system (using a lamp light source) applicable to a general exposure apparatus. U.S. Pat. No. 4,666,273 discloses an example of a step and repeat type exposure apparatus. U.S. patent application Ser. No. 5,194,893 discloses a scanning type exposure system and, in particular, an illumination optical system, an illumination area, interference systems on the mask side and on the reticle side, an auto-focus mechanism, and an alignment optical system. U.S. Pat. No. 5,253,110 discloses an illumination optical system (using a laser light source) which is applied to a step and repeat type exposure apparatus, though it is also applicable to a scanning type exposure apparatus. U.S. Pat. No. 5,333,035 discloses a modified optical system which is applied to a general exposure apparatus. U.S. Pat. No. 5,379,091 discloses an illumination optical system (using a laser light source) which is applied to a scanning type exposure apparatus.

Figure 3:
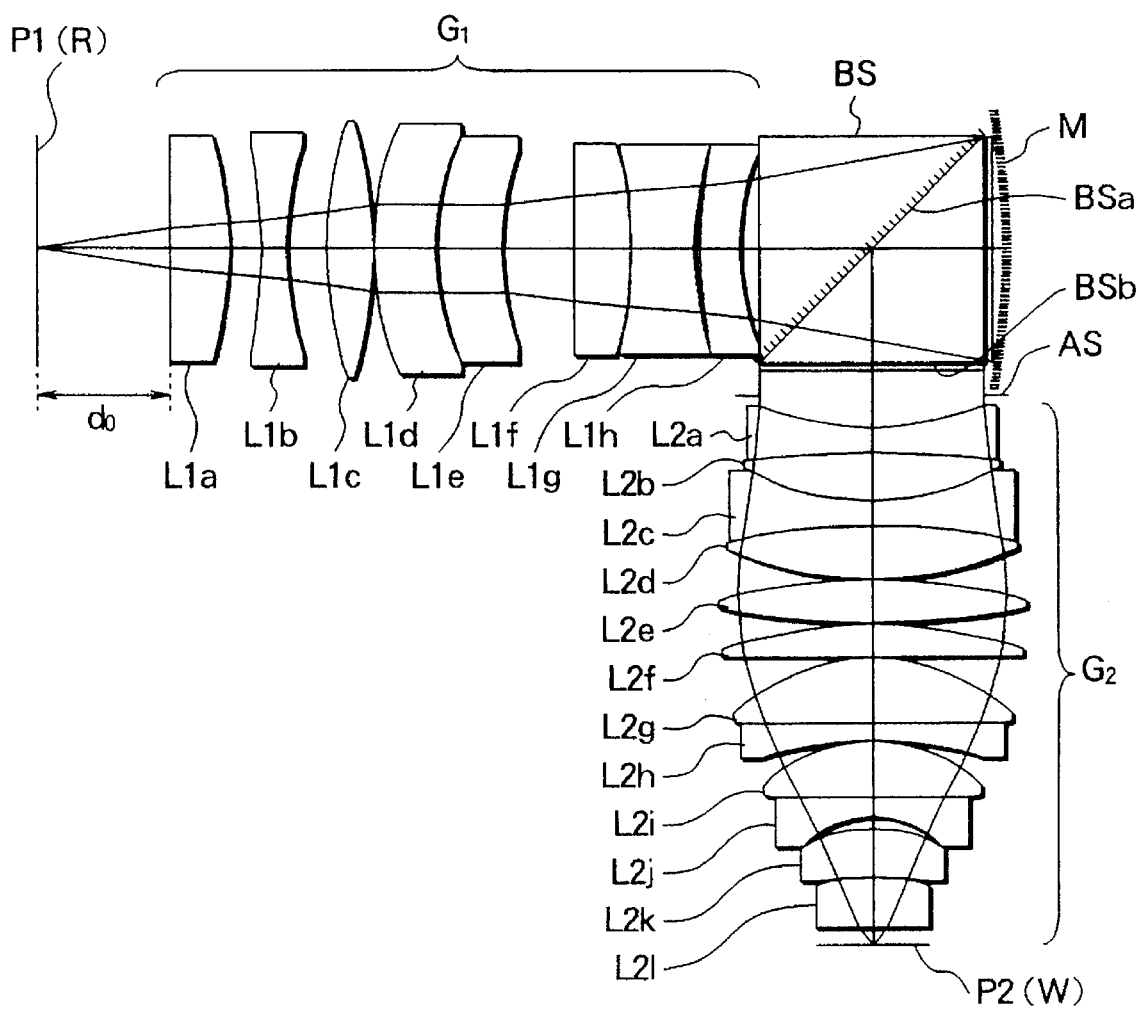
FIG. 3 is a view showing a lens arrangement drawing of the catadioptric optical system in the first embodiment according to the present invention.
Figure 4:
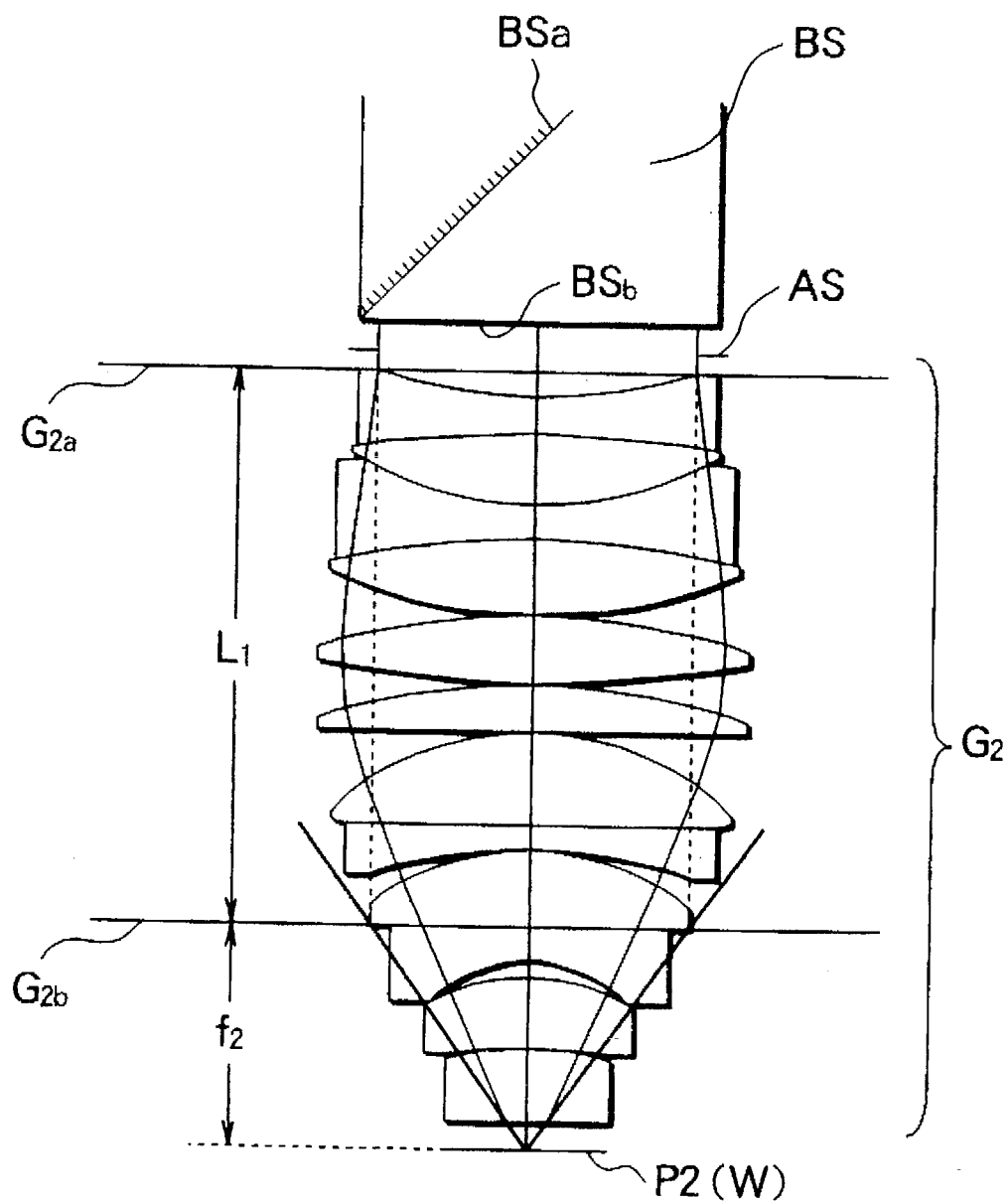
FIG. 4 is a view showing a relationship between the light-entering position (i.e., light-entering surface $G_{2a}$) and the rear-side principal point position (i.e., rear-side principal plane $G_{2b}$) in the second lens group in the catadioptric optical system in accordance with the present invention.

In the following, embodiments of the catadioptric optical system in accordance with the present invention will be explained. FIG. 3 is a lens arrangement drawing of the catadioptric optical system in the first embodiment according to the present invention.

In FIG. 3, an illumination optical system 1 illuminates a reticle R, in which a predetermined pattern has been formed, with illumination light of ArF excimer laser (from a light source 100), for example. The light from the reticle R, after passing through a first lens group $G_1$, passes through a direction change surface $BS_a$ of a beam splitter BS and then is reflected by a concave reflecting mirror M so as to re-enter the beam splitter BS. The light from the concave mirror M, after being reflected by the direction change surface $BS_a$ of the beam splitter BS, passes through an aperture stop AS, which is disposed at the beam splitter BS so as to face an output surface $BS_b$, and then passes through a second lens group $G_2$ to impinge on a wafer W. On the wafer W, a reduced image of the reticle R is formed. The light reflected by the direction change surface $BS_a$ has been collimated by the concave mirror M beforehand.

In this embodiment, the beam splitter BS comprises two rectangular prisms which are joined together. On the slant surface of one of the rectangular prisms, a thin film is deposited. In this embodiment, the thin film on the joint surface functions to transmit the light from the first lens group $G_1$ therethrough while reflecting the light from the concave mirror M.

In the following, with reference to FIG. 3, the lens configuration of each lens group in the first embodiment will be explained. The first lens group $G_1$ comprises, in the following order from the object side, a positive lens component $L_{1a}$ having a double convex form in which a stronger convex surface is directed toward the beam splitter BS; a negative lens component $L_{1b}$ having a double concave form; a positive lens component $L_{1c}$ having a double convex form; a negative lens component $L_{1d}$ having a meniscus form whose convex surface is directed toward the object; a negative lens component $L_{1e}$ having a meniscus form whose convex surface is similarly directed toward the object; a positive lens component $L_{1f}$ having a meniscus form whose concave surface is directed toward the object; a negative lens component $L_{1g}$ having a double concave form; and a negative lens component $L_{1h}$ whose convex surface is directed toward the object.

Also, the second lens group $G_2$ comprises, in the following order from the side of the aperture stop AS, a negative lens component $L_{2a}$ having a double concave form; a positive lens component $L_{2b}$ having a double convex form; a negative lens component $L_{2c}$ having a double concave form; a positive lens component having a double convex form; a positive lens component $L_{2e}$ having a double convex form; a positive lens component $L_{2f}$ having a double convex form in which a stronger convex surface is directed toward the aperture stop AS; a positive lens component $L_{2g}$ having a double convex form in which a stronger convex surface is similarly directed toward the aperture stop AS; a negative lens component $L_{2h}$ having a meniscus form whose convex surface is directed toward the aperture stop AS; a positive lens component $L_{2i}$ having a meniscus form whose convex surface is directed toward the aperture stop AS; a negative lens component $L_{2j}$ having a meniscus form whose convex surface is directed toward the aperture stop AS; a positive lens component $L_{2k}$ having a meniscus form whose convex surface is directed toward the aperture stop AS; and a positive lens component $L_{2l}$ having a meniscus form whose convex surface is similarly directed toward the aperture stop AS.

In the following Tables 1-1 and 1-2, values of items in this embodiment are listed. In this embodiment, the magnification of the whole system is ¼ (reduction), the numerical aperture NA on the side of the wafer W is 0.6, and the working distance on the side of the wafer W is 15.0 mm. As shown in FIG. 5 which is a plan view showing the exposure area on the wafer W in the catadioptric optical system in accordance with the first embodiment of the present invention, this catadioptric optical system has a slit-like exposure area of 30 mm×6 mm at the range where the image height on the wafer W from the optical axis Ax is 15.3 mm or less. Also, the beam splitter BS in this embodiment has a rectangular parallelopiped form of 170 mm×170 mm×190 mm.

Also, in Table 1-1, the radius of curvature r, surface distance d, and glass material of each surface are indicated for the individual surfaces in the order from the first surface, which corresponds to the pattern-forming surface of the reticle R as the object surface, toward the second surface which corresponds to the surface of the wafer W as the image surface. In Table 1-1, the sign of the radius of curvature r in each surface is set such that it is positive when the convex surface is directed toward the reticle R between the reticle R and the concave mirror M and that it is positive when the convex surface is directed toward the beam splitter BS between the beam splitter BS and the wafer W. Also, the sign of the surface distance d is set such that it is negative in the optical path from the concave mirror M to the direction change surface of the beam splitter BS while it is positive in the other optical paths. Further, as the glass materials, $CaF_2$ and $SiO_2$ indicate fluorite and silica glass, respectively. Here, refractive indexes of silica glass and fluorite at the standard wavelength used (i.e., wavelength of ArF laser: λ=193.4 nm) are as follows:

Silica glass: 1.56019
Fluorite: 1.50138

TABLE 1-1

First Embodiment
d0 = 94.539

| | r | d | Glass Material | |
|---|---|---|---|---|
| 1 | −5313.040 | 42.330 | SiO$_2$ | |
| 2 | −329.118 | 23.191 | | |
| 3 | −454.958 | 18.864 | CaF$_2$ | |
| 4 | 272.492 | 31.123 | | |
| 5 | 338.834 | 31.042 | SiO$_2$ | |
| 6 | −344.186 | 0.500 | | |
| 7 | 229.022 | 45.000 | SiO$_2$ | |
| 8 | 184.586 | 2.298 | | |
| 9 | 208.542 | 45.000 | SiO$_2$ | |
| 10 | 1732.582 | 56.174 | | |
| 11 | −4435.970 | 42.860 | SiO$_2$ | |
| 12 | −244.757 | 0.500 | | |
| 13 | −288.840 | 45.000 | CaF$_2$ | |
| 14 | 233.444 | 5.342 | | |
| 15 | 433.000 | 29.121 | SiO$_2$ | |
| 16 | 268.594 | 10.042 | | |
| 17 | 0.000 | 170.000 | SiO$_2$ | Beam splitter BS |
| 18 | 0.000 | 10.000 | | |
| 19 | −623.184 | −10.000 | | Concave mirror M |
| 20 | 0.000 | −85.000 | SiO$_2$ | |
| 21 | 0.000 | 85.000 | SiO$_2$ | Direction change surface |
| 22 | 0.000 | 20.000 | | |
| 23 | 0.000 | 22.917 | | Aperture stop AS |
| 24 | −246.212 | 19.407 | SiO$_2$ | |
| 25 | 1018.290 | 0.657 | | |
| 26 | 1228.970 | 32.523 | CaF$_2$ | |
| 27 | −190.064 | 0.500 | | |
| 28 | −191.929 | 15.000 | SiO$_2$ | |
| 29 | 424.920 | 1.933 | | |
| 30 | 503.632 | 37.933 | CaF$_2$ | |
| 31 | −260.380 | 0.500 | | |
| 32 | 441.375 | 32.753 | CaF$_2$ | |
| 33 | −563.177 | 0.500 | | |
| 34 | 378.243 | 23.321 | CaF$_2$ | |
| 35 | −13558.170 | 0.500 | | |
| 36 | 152.386 | 44.866 | CaF$_2$ | |
| 37 | 3098.000 | 0.500 | | |
| 38 | 2231.920 | 15.006 | SiO$_2$ | |
| 39 | 296.582 | 0.533 | | |
| 40 | 123.151 | 38.469 | CaF$_2$ | |
| 41 | 7856.190 | 0.815 | | |
| 42 | 7240.660 | 15.000 | SiO$_2$ | |
| 43 | 74.423 | 7.394 | | |
| 44 | 103.429 | 35.012 | CaF$_2$ | |
| 45 | 292.945 | 1.711 | | |
| 46 | 192.719 | 34.643 | SiO$_2$ | |
| 47 | 1452.820 | 15.000 | | |

Table 1-2

Figure 6:
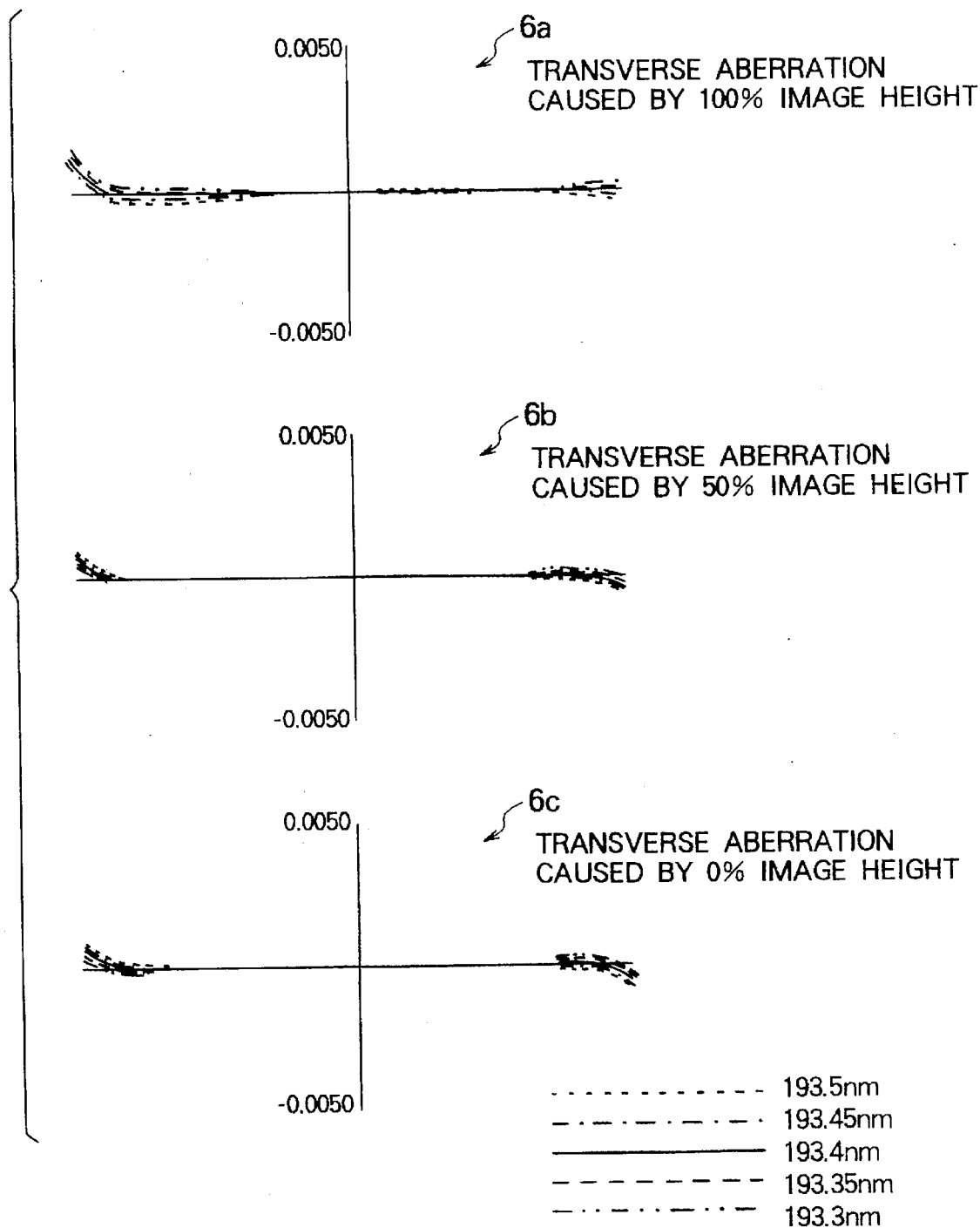
FIG. 6 is a view showing transverse aberrations in the first embodiment shown in FIG. 3, in particular, the upper, middle, and lower parts thereof respectively representing a transverse aberration diagram 6a at an image height of 100%, a transverse aberration diagram 6b at an image height of 50%, and a transverse aberration diagram 6c at an image height of 0%.

The condition correspondence values of the first embodiment (1) $1/\beta M = -0.062$
(2) $L1/f2 = 1.842$
(3) $\beta 2/\beta = -0.10$
(4) $D1/fM = 0.45$
(5) $D2 \cdot NA/f2 = 1.37$
(6) $(\phi B^{1/2} - 4dW \cdot NA)/(f2 \cdot (NA)^2) = 3.03$ FIG. 6 shows transverse aberrations of the first embodiment. Here, 6a, 6b, and 6c respectively show the transverse aberration diagrams at 100% image height (image height at 15.3 mm), at 50% image height (image height at 7.65 mm), and 0% image height (on the optical axis: image height of 0.0 mm). In each transverse aberration diagram, continuous line indicates an aberration curve at the standard wavelength ($\lambda$=193.4 nm), dotted line indicates an aberration curve at a wavelength of $\lambda$=193.5 nm, alternate long and short dash line indicates an aberration curve at a wavelength of $\lambda$=193.45 nm, broken line indicates an aberration curve at a wavelength of $\lambda$=193.35 nm, and alternate long and two short dashes line indicates an aberration curve at a wavelength of $\lambda$=193.3 nm. In view of each aberration diagram shown in FIG. 6, it is understood that aberrations are favorably corrected in the catadioptric optical system in this embodiment in spite of the fact that a very large numerical aperture, NA=0.6, is attained. In particular, it is understood that chromatic aberration in the range of 193.4 nm±0.1 mm is corrected, thereby representing an excellent image-forming characteristic.

Figure 7:
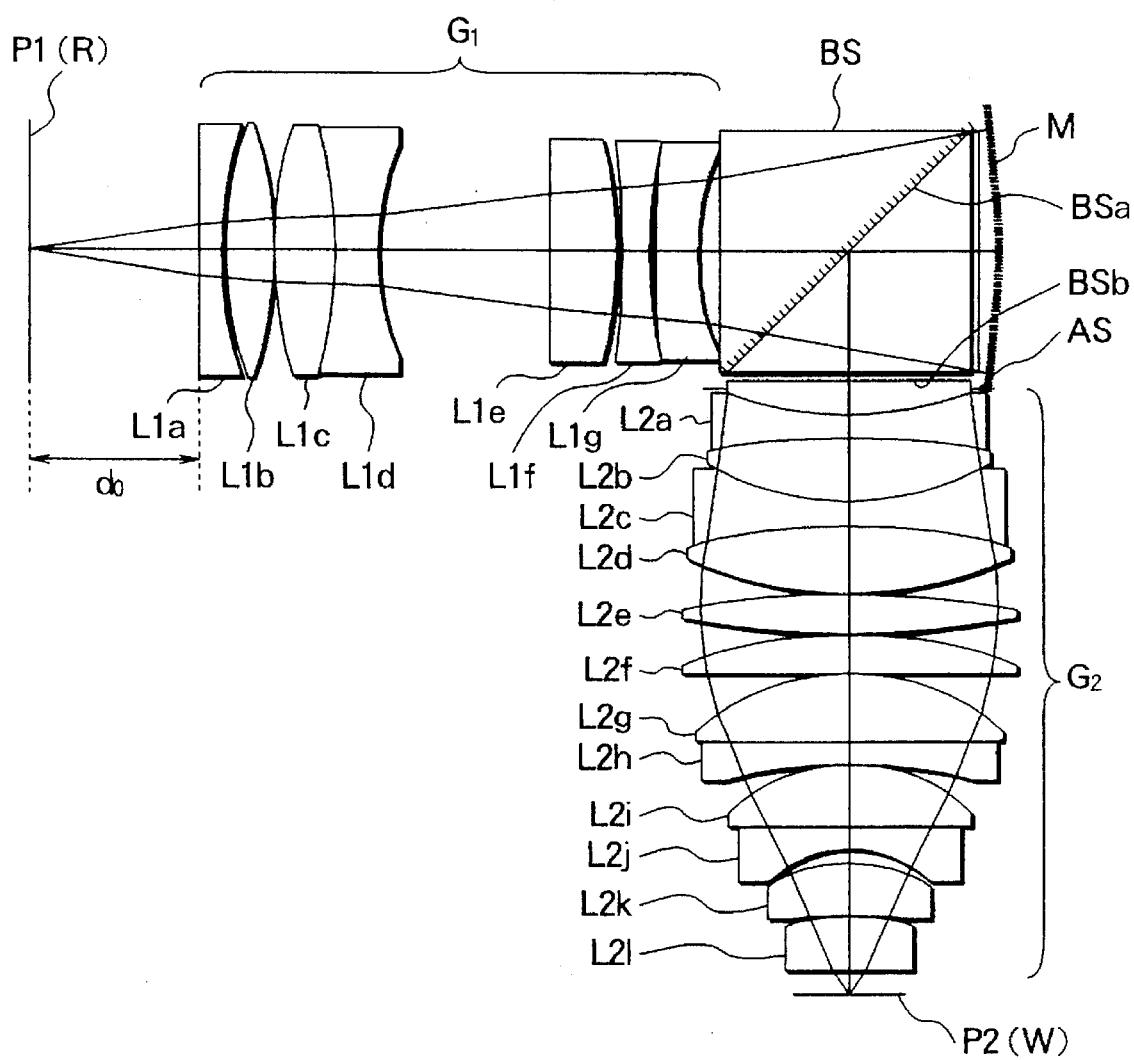
FIG. 7 is a view showing a lens arrangement drawing of the catadioptric optical system in the second embodiment according to the present invention.

In the following, with reference to FIG. 7, a second embodiment in accordance with the present invention will be explained. FIG. 7 is a lens arrangement drawing of the catadioptric optical system in the second embodiment according to the present invention.

Since the basic configuration of the catadioptric optical system shown in FIG. 7 is substantially the same as that of the catadioptric optical system in the first embodiment shown in FIG. 3, its explanation is omitted here and only the lens configuration of each lens group will be explained.

In FIG. 7, the first lens group $G_1$ comprises, in the following order from the object side, a negative lens component $L_{1a}$ having a meniscus form whose convex surface is directed toward the object; a positive lens component $L_{1b}$ having a double convex form; a positive lens component $L_{1c}$ having a double convex form; a negative lens component $L_{1d}$ having a double concave form; a positive lens component $L_{1e}$ having a meniscus form whose concave surface is directed toward the object; a negative lens component $L_{1f}$ having a double concave form; and a negative lens component $L_{1g}$ having a meniscus form whose convex surface is directed toward the object.

Also, the second lens group $G_2$ comprises, in the following order from the side of the aperture stop AS, a negative lens component $L_{2a}$ having a double concave form; a positive lens component $L_{2b}$ having a double convex form; a negative lens component $L_{2c}$ having a double concave form; a positive lens component $L_{2d}$ having a double convex form; a positive lens component $L_{2e}$ similarly having a double convex form; a positive lens component $L_{2f}$ having a meniscus form whose convex surface is directed toward the aperture stop AS; a positive lens component $L_{2g}$ having a double convex form in which a stronger convex surface is directed toward the aperture stop AS; a negative lens component $L_{2h}$ having a meniscus form whose convex surface is directed toward the aperture stop AS; a positive lens component $L_{2i}$ having a meniscus form whose convex surface is directed toward the aperture stop AS; a negative lens component $L_{2j}$ having a double concave form in which a stronger concave surface is directed toward the wafer W; a positive lens component $L_{2k}$ having a meniscus form whose convex surface is directed toward the aperture stop AS; and a positive lens component $L_{2l}$ having a meniscus form whose convex surface is similarly directed toward the aperture stop AS.

In the following Tables 2-1 and 2-2, values of items in this embodiment are listed. In this embodiment, as in the case of the above-mentioned first embodiment, the magnification of the whole system is ¼ (reduction), the numerical aperture NA on the side of the wafer W is 0.6, and the working distance on the side of the wafer W is 15.0 mm. As in the case of the first embodiment, the catadioptric optical system in the second embodiment has a slit-like exposure area of 30 mm×6 mm at the range where the image height on the wafer W from the optical axis Ax is 15.3 mm or less. Also, the beam splitter BS in this embodiment has a rectangular parallelopiped form of 170 mm×170 mm×190 mm.

Also, in Table 2-1, the radius of curvature r, surface distance d, and glass material of each surface are indicated for the individual surfaces in the order from the first surface, which corresponds to the pattern-forming surface of the reticle R as the object surface, toward the second surface which corresponds to the surface of the wafer W as the image surface. In Table 2-1, the sign of the radius of curvature r in each surface is set such that it is positive when the convex surface is directed toward the reticle R between the reticle R and the concave mirror M and that it is positive when the convex surface is directed toward the beam splitter BS between the beam splitter BS and the wafer W. Also, the sign of the surface distance d is set such that it is negative in the optical path from the concave mirror M to the direction change surface of the beam splitter BS while it is positive in the other optical paths. Further, as the glass materials, $CaF_2$ and $SiO_2$ indicate fluorite and silica glass, respectively. Here, refractive indexes of silica glass and fluorite at the standard wavelength used (i.e., wavelength of ArF laser: $\lambda$=193.4 nm) are as follows:

Silica glass: 1.56019
Fluorite: 1.50138

TABLE 2-1

| | Second Embodiment d0 = 111.403 | | |
|---|---|---|---|
| | r | d | Glass Material |
| 1 | 5471.605 | 15.000 | $CaF_2$ |
| 2 | 272.290 | 2.678 | |
| 3 | 277.567 | 31.750 | $SiO_2$ |
| 4 | −278.590 | 0.500 | |
| 5 | 307.964 | 38.658 | $SiO_2$ |
| 6 | −321.548 | 0.500 | |
| 7 | −307.926 | 28.172 | $CaF_2$ |
| 8 | 185.540 | 116.871 | |
| 9 | −6054.190 | 45.000 | $SiO_2$ |
| 10 | −326.561 | 3.925 | |
| 11 | −437.618 | 18.547 | $CaF_2$ |
| 12 | 429.454 | 3.774 | |
| 13 | 791.303 | 28.999 | $CaF_2$ |
| 14 | 197.545 | 13.348 | |
| 15 | 0.000 | 170.000 | $SiO_2$ Beam splitter BS |
| 16 | 0.000 | 10.000 | |
| 17 | −600.094 | −10.000 | Concave mirror M |
| 18 | 0.000 | −85.000 | $SiO_2$ |
| 19 | 0.000 | 85.000 | $SiO_2$ Direction change surface |
| 20 | 0.000 | 5.000 | |
| 21 | 0.000 | 18.267 | Aperture stop AS |
| 22 | −228.968 | 15.000 | $SiO_2$ |
| 23 | 602.629 | 1.000 | |
| 24 | 596.556 | 39.120 | $CaF_2$ |
| 25 | −193.759 | 0.500 | |
| 26 | −198.735 | 15.599 | $SiO_2$ |
| 27 | 414.383 | 1.371 | |
| 28 | 466.129 | 43.827 | $CaF_2$ |
| 29 | −250.352 | 0.500 | |
| 30 | 607.920 | 26.660 | $CaF_2$ |
| 31 | −570.532 | 0.500 | |
| 32 | 319.703 | 24.752 | $CaF_2$ |
| 33 | 5248.170 | 0.500 | |
| 34 | 150.926 | 44.958 | $CaF_2$ |
| 35 | −11154.640 | 0.500 | |
| 36 | 6931.942 | 15.000 | $SiO_2$ |
| 37 | 324.944 | 0.500 | |
| 38 | 123.172 | 38.693 | $CaF_2$ |

TABLE 2-1-continued

| | Second Embodiment d0 = 111.403 | | |
|---|---|---|---|
| | r | d | Glass Material |
| 39 | 27743.950 | 0.506 | |
| 40 | −22043.850 | 15.000 | $SiO_2$ |
| 41 | 73.840 | 8.552 | |
| 42 | 103.200 | 33.698 | $CaF_2$ |
| 43 | 346.408 | 1.818 | |
| 44 | 217.213 | 33.291 | $SiO_2$ |
| 45 | 1371.742 | 15.000 | |

Table 2-2

Figure 8:
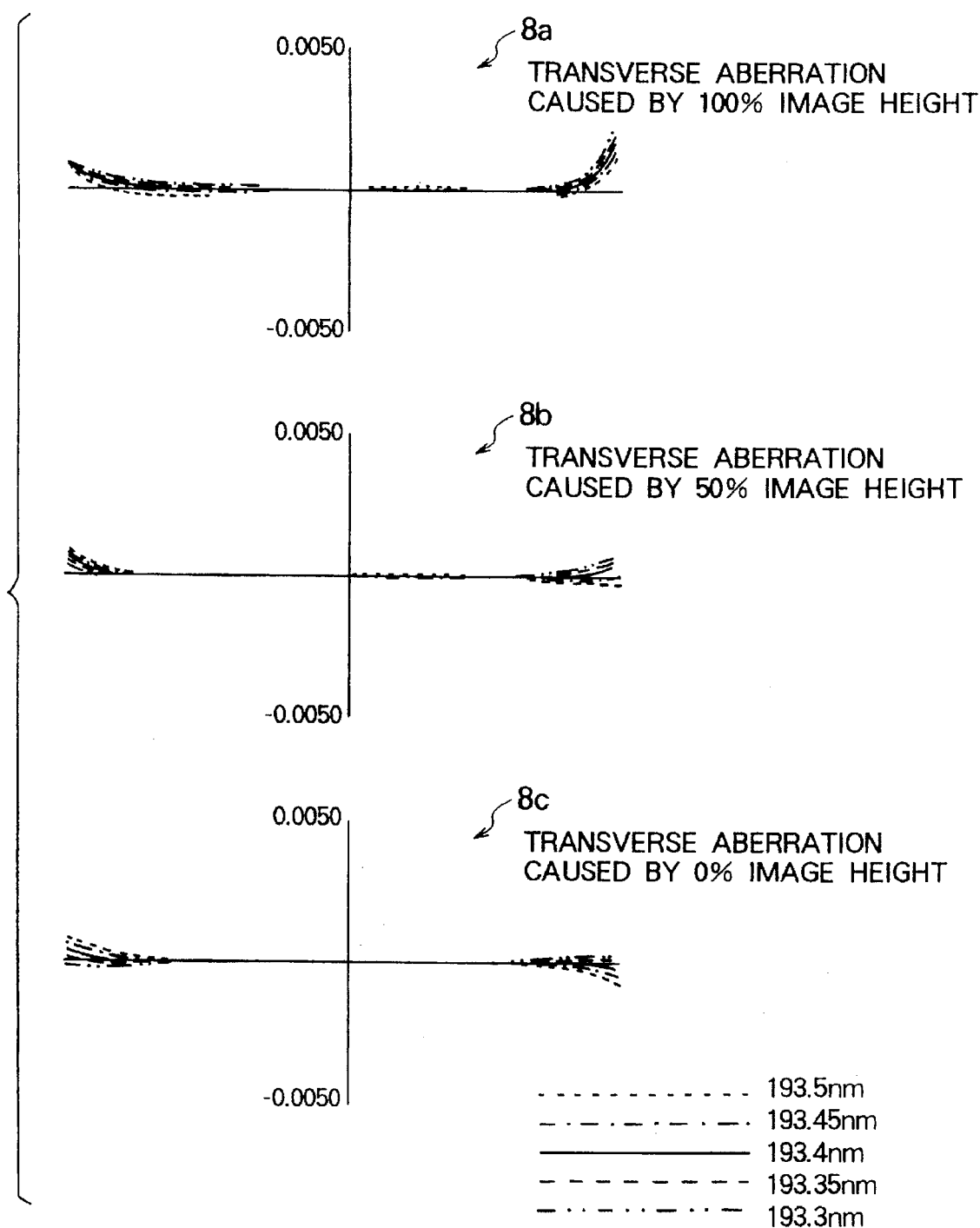
FIG. 8 is a view showing transverse aberrations in the second embodiment shown in FIG. 7, in particular, the upper, middle, and lower parts thereof respectively representing a transverse aberration diagram 8a at an image height of 100%, a transverse aberration diagram 8b at an image height of 50%, and a transverse aberration diagram 8c at an image height of 0%.

The condition correspondence values of the second embodiment
(1) $1/\beta M=-0.077$
(2) $L1/f2=1.924$
(3) $\beta 2/\beta=-0.13$
(4) $D1/fM=0.41$
(5) $D2 \cdot NA/f2=1.31$
(6) $(\phi B^{1/2}-4dW \cdot NA)/(f2 \cdot (NA)^2)=3.09$ FIG. 8 shows transverse aberrations of the second embodiment. Here, 8a, 8b, and 8c respectively show the transverse aberration diagrams at 100% image height (image height at 15.3 mm), at 50% image height (image height at 7.65 mm), and 0% image height (on the optical axis: image height of 0.0 mm). In each transverse aberration diagram, the continuous line indicates an aberration curve at the standard wavelength ($\lambda$=193.4 nm), the dotted line indicates an aberration curve at a wavelength of $\lambda$=193.5 nm, the alternate long and short dash line indicates an aberration curve at a wavelength of $\lambda$=193.45 nm, the broken line indicates an aberration curve at a wavelength of $\lambda$=193.35 nm, and the alternate long and short dashes line indicates an aberration curve at a wavelength of $\lambda$=193.3 nm. In view of each aberration diagram shown in FIG. 8, it is understood that aberrations are favorably corrected in the catadioptric optical system in this embodiment in spite of the fact that a very large numerical aperture, NA=0.6, is attained. In particular, it is understood that chromatic aberration in the range of 193.4 nm±0.1 mm is corrected, thereby representing an excellent image-forming characteristic.

Figure 9:
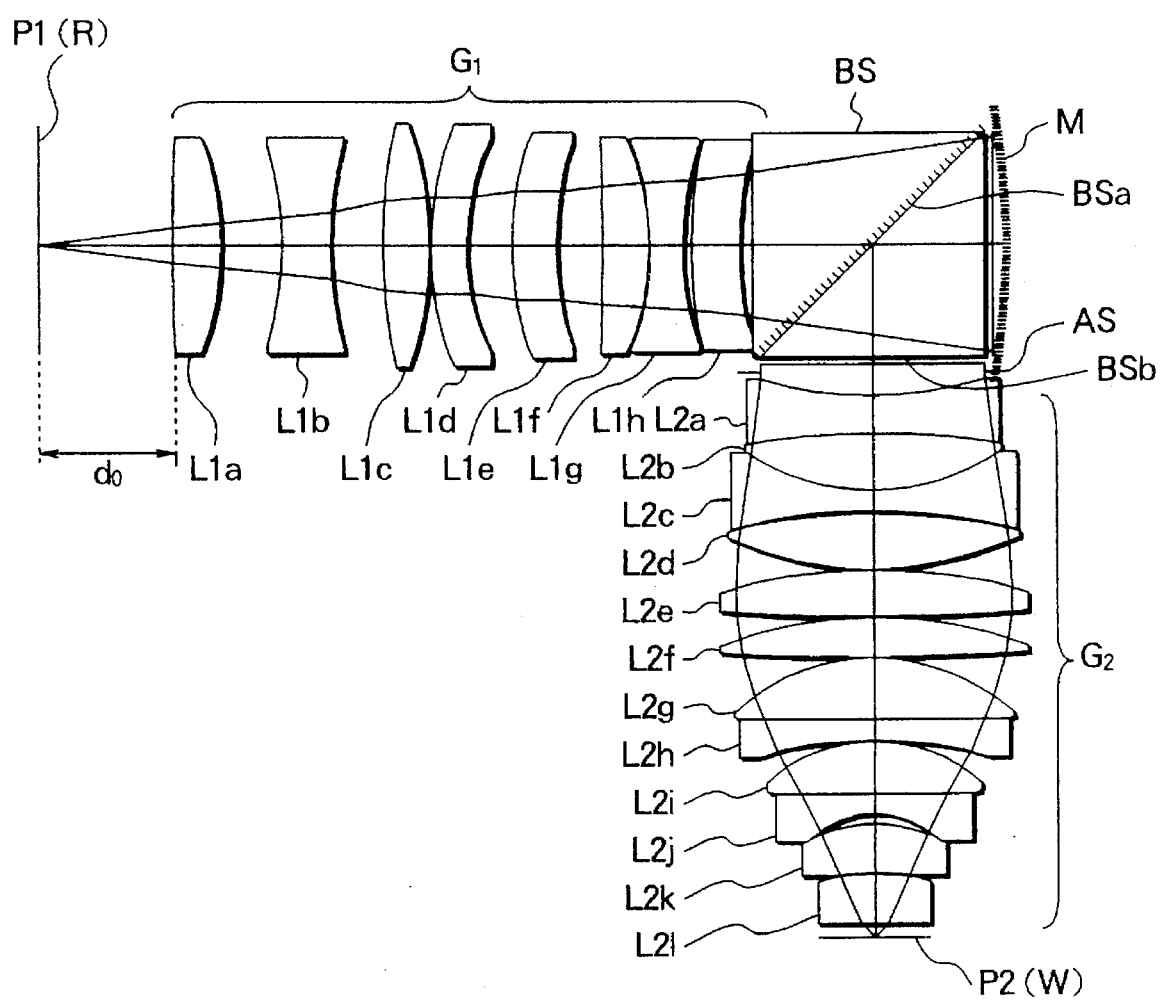
FIG. 9 is a view showing a lens arrangement drawing of the catadioptric optical system in the third embodiment according to the present invention.

In the following, with reference to FIG. 9, a third embodiment in accordance with the present invention will be explained. FIG. 9 is a lens arrangement drawing of the catadioptric optical system in the third embodiment according to the present invention.

Since the basic configuration of the catadioptric optical system shown in FIG. 9 is substantially the same as that of the catadioptric optical system in the first embodiment shown in FIG. 3, its explanation is omitted here and only the lens configuration of each lens group will be explained.

In FIG. 9, the first lens group $G_1$ comprises, in the following order from the object side, a positive lens component $L_{1a}$ having a double convex form in which a stronger convex surface is directed toward the beam splitter BS; a negative lens component $L_{1b}$ having a double concave form; a positive lens component $L_{1c}$ having a double convex form; a negative lens component $L_{1d}$ having a meniscus form whose concave surface is directed toward the object; a positive lens component $L_{1e}$ having a meniscus form whose convex surface is directed toward the object; a negative lens component $L_{1f}$ having a meniscus form whose concave surface is directed toward the object; a negative lens component $L_{1g}$ having a double concave form; and a negative lens component L1$h$ having a meniscus form whose convex surface is directed toward the object.

Also, the second lens group $G_2$ comprises, in the following order from the side of the aperture stop AS, a negative lens component $L_{2a}$ having a double concave form; a positive lens component $L_{2b}$ having a double convex form in which a stronger convex surface is directed toward the image; a negative lens component $L_{2c}$ having a double concave form; a positive lens component $L_{2d}$ having a double convex form in which a stronger convex surface is directed toward the image; a positive lens component $L_{2e}$ having a double convex form in which a stronger convex surface is directed toward the aperture stop AS; a positive lens component $L_{2f}$ having a double convex form in which a stronger convex surface is similarly directed toward the aperture stop AS; a positive lens component $L_{2g}$ having a double convex form in which a stronger convex surface is similarly directed toward the aperture stop AS; a negative lens component $L_{2h}$ having a double concave form in which a stronger concave surface is directed toward the image; a positive lens component $L_{2i}$ having a double convex form in which a stronger convex surface is directed toward the aperture stop AS; a negative lens component $L_{2j}$ having a meniscus form whose convex surface is directed toward the aperture stop AS; a positive lens component $L_{2k}$ having a meniscus form whose convex surface is directed toward the aperture stop AS; and a positive lens component $L_{2l}$ having a meniscus form whose convex surface is similarly directed toward the aperture stop AS.

In the following Tables 3-1 and 3-2, values of items in this embodiment are listed. In this embodiment, as in the case of the above-mentioned first embodiment, the magnification of the whole system is ¼ (reduction), the numerical aperture NA on the side of the wafer W is 0.6, and the working distance on the side of the wafer W is 15.0 mm. As in the case of the first embodiment, the catadioptric optical system in the third embodiment has a slit-like exposure area of 30 mm×6 mm at the range where the image height on the wafer W from the optical axis Ax is 15.3 mm or less. Also, the beam splitter BS in this embodiment has a rectangular parallelopiped form of 170 mm×170 mm×190 mm.

Also, in Table 3-1, the radius of curvature r, surface distance d, and glass material of each surface are indicated for the individual surfaces in the order from the first surface, which corresponds to the pattern-forming surface of the reticle R as the object surface, toward the second surface which corresponds to the wafer W surface as the image surface. In Table 3-1, the sign of the radius of curvature r in each surface is set such that it is positive when the convex surface is directed toward the reticle R between the reticle R and the concave mirror M and that it is positive when the convex surface is directed toward the beam splitter BS between the beam splitter BS and the wafer W. Also, the sign of the surface distance d is set such that it is negative in the optical path from the concave mirror M to the direction change surface of the beam splitter BS while it is positive in the other optical paths. Further, as the glass materials, $CaF_2$ and $SiO_2$ indicate fluorite and silica glass, respectively. Here, refractive indexes of silica glass and fluorite at the standard wavelength used (i.e., wavelength of ArF laser: $\lambda=193.4$ nm) are as follows:

Silica glass: 1.56019
Fluorite: 1.50138

TABLE 3-1

Third Embodiment
d0 = 96.384

| | r | d | Glass Material | |
| --- | --- | --- | --- | --- |
| 1 | 1566.352 | 33.601 | $SiO_2$ | |
| 2 | −258.445 | 42.686 | | |
| 3 | −303.358 | 35.000 | $CaF_2$ | |
| 4 | 254.513 | 39.688 | | |
| 5 | 408.129 | 35.000 | $SiO_2$ | |
| 6 | −292.562 | 0.500 | | |
| 7 | 238.980 | 28.106 | $SiO_2$ | |
| 8 | 177.718 | 35.520 | | |
| 9 | 236.585 | 35.000 | $SiO_2$ | |
| 10 | 258.786 | 35.249 | | |
| 11 | −1574.830 | 35.000 | $SiO_2$ | |
| 12 | −195.650 | 0.500 | | |
| 13 | −220.429 | 25.000 | $CaF_2$ | |
| 14 | 228.713 | 7.071 | | |
| 15 | 380.419 | 35.000 | $SiO_2$ | |
| 16 | 274.848 | 10.847 | | |
| 17 | 0.000 | 170.000 | $SiO_2$ | Beam splitter BS |
| 18 | 0.000 | 10.000 | | |
| 19 | −644.053 | −10.000 | | Concave mirror M |
| 20 | 0.000 | −85.000 | $SiO_2$ | |
| 21 | 0.000 | 85.000 | $SiO_2$ | Direction change surface |
| 22 | 0.000 | 10.000 | | |
| 23 | 0.000 | 16.475 | | Aperture stop AS |
| 24 | −240.493 | 27.541 | $SiO_2$ | |
| 25 | 609.289 | 0.500 | | |
| 26 | 648.361 | 39.879 | $CaF_2$ | |
| 27 | −161.540 | 0.500 | | |
| 28 | −161.204 | 15.000 | $SiO_2$ | |
| 29 | 432.174 | 2.340 | | |
| 30 | 513.767 | 39.791 | $CaF_2$ | |
| 31 | −245.896 | 0.500 | | |
| 32 | 397.672 | 35.000 | $CaF_2$ | |
| 33 | −1373.400 | 0.500 | | |
| 34 | 350.822 | 28.205 | $CaF_2$ | |
| 35 | −1504.430 | 0.500 | | |
| 36 | 152.096 | 44.808 | $CaF_2$ | |
| 37 | −3015.120 | 0.546 | | |
| 38 | −3831.930 | 15.302 | $SiO_2$ | |
| 39 | 292.927 | 0.657 | | |
| 40 | 122.588 | 34.934 | $CaF_2$ | |
| 41 | 1224.997 | 0.539 | | |
| 42 | 1218.161 | 15.188 | $SiO_2$ | |
| 43 | 74.562 | 8.605 | | |
| 44 | 108.074 | 35.000 | $SiO_2$ | |
| 45 | 377.013 | 1.406 | | |
| 46 | 259.877 | 35.000 | $SiO_2$ | |
| 47 | 767.722 | 15.000 | | |

Table 3-2

Figure 10:
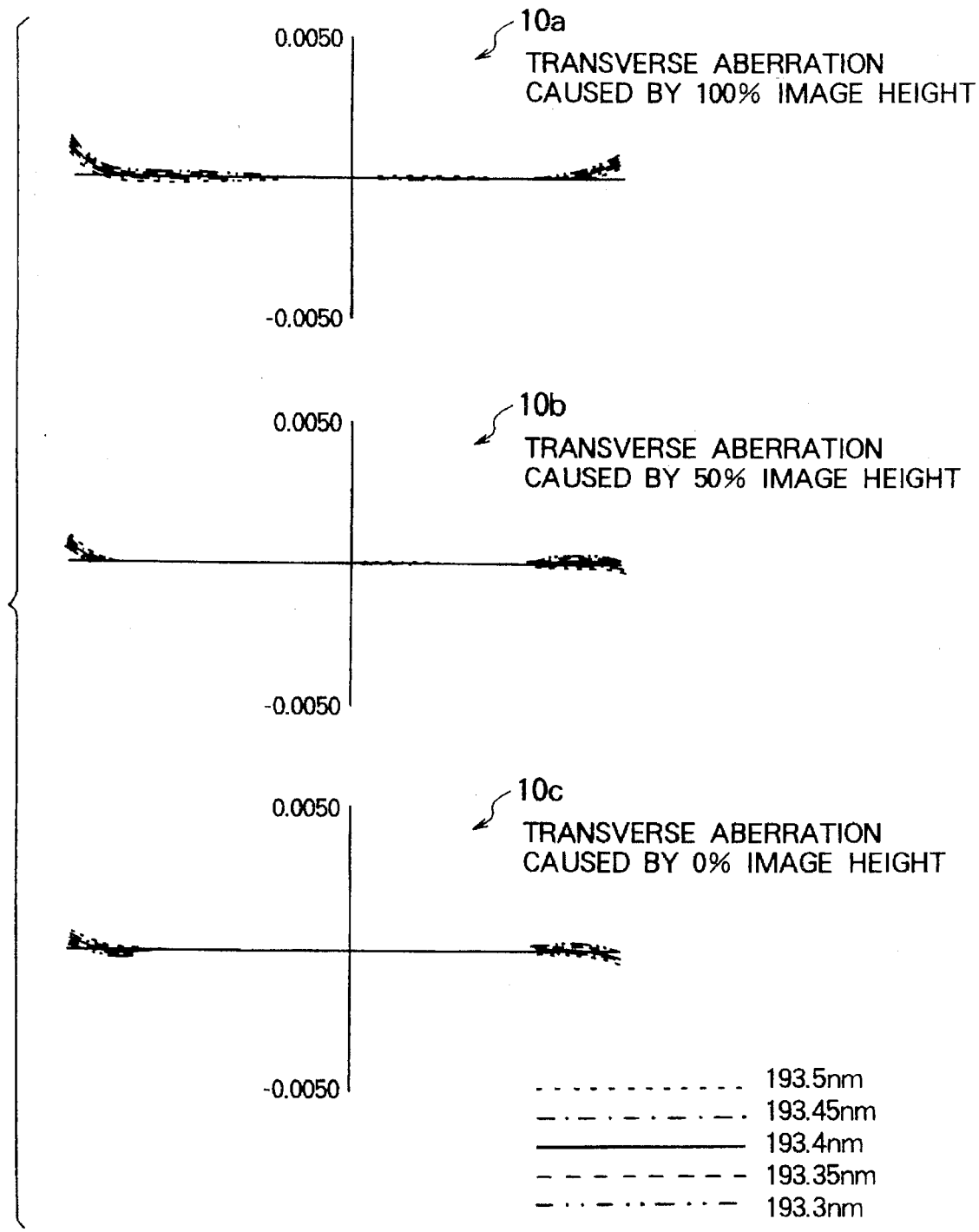
FIG. 10 is a view showing transverse aberration in the third embodiment shown in FIG. 9, in particular, the upper, middle, and lower parts thereof respectively representing a transverse aberration diagram 10a at an image height of 100%, a transverse aberration diagram 10b at an image height of 50%, and a transverse aberration diagram 10c at an image height of 0%.

The condition correspondence values of the third embodiment (1) $1/\beta M=-0.116$
(2) $L1/f2=2.053$
(3) $\beta 2/\beta=-0.18$
(4) $D1/fM=0.40$
(5) $D2\cdot NA/f2=1.37$
(6) $(\phi B^{1/2}-4dW\cdot NA)/(f2\cdot (NA)^2)=3.07$ FIG. 10 shows transverse aberrations of the second embodiment. Here, 10$a$, 10$b$, and 10$c$ respectively show the transverse aberration diagrams at 100% image height (image height at 15.3 mm), at 50% image height (image height at 7.65 mm), and 0% image height (on the optical axis: image height of 0.0 mm). In each transverse aberration diagram, the continuous line indicates an aberration curve at the standard wavelength ($\lambda=193.4$ nm), the dotted line indicates an aberration curve at a wavelength of λ=193.5 nm, the alternate long and short dash line indicates an aberration curve at a wavelength of λ=193.45 nm, the broken line indicates an aberration curve at a wavelength of λ=193.35 nm, and the alternate long and the two short dashes line indicates an aberration curve at a wavelength of λ=193.3 nm. In view of each aberration diagram shown in FIG. 10, it is understood that aberrations are favorably corrected in the catadioptric optical system in this embodiment in spite of the fact that a very large numerical aperture, NA=0.6, is attained. In particular, it is understood that chromatic aberration in the range of 193.4 nm±0.1 mm is corrected, thereby representing an excellent image-forming characteristic.

In the above-mentioned embodiments, the direction change surface $BS_a$ of the beam splitter BS is preferably a polarizing separation surface made of a dielectric multilayer film, for example. In this case, a λ/4 plate is disposed on a surface of the beam splitter facing the concave mirror M. Also, when aberration occurs in the above-mentioned dielectric multilayer film, it is preferable that a thin film which cancels the aberration occurring in the dielectric multilayer film is disposed on at least one of the surfaces of the beams splitter BS respectively facing the first lens group $G_1$, the concave mirror M, and the second lens group $G_2$. Such a thin film has a partially different thickness or refractive index, for example.

Though the above-mentioned embodiments are configured such that the luminous flux directed from the first lens group $G_1$ toward the concave mirror M passes through the direction change surface $BS_a$ of the beam splitter BS, while the luminous flux directed from the concave mirror M toward the second lens group $G_2$ is reflected by the direction change surface $BS_a$ of the beam splitter BS; it is equivalent, in terms of optical design, to a configuration in which the luminous flux from the first lens group $G_1$ is reflected by the direction change surface $BS_a$ of the beam splitter BS so as to be directed to the concave mirror M, while the luminous flux from the concave mirror M passes through the direction change surface $BS_a$ of the beam splitter BS so as to be directed to the second lens group $G_2$.

Figure 11:
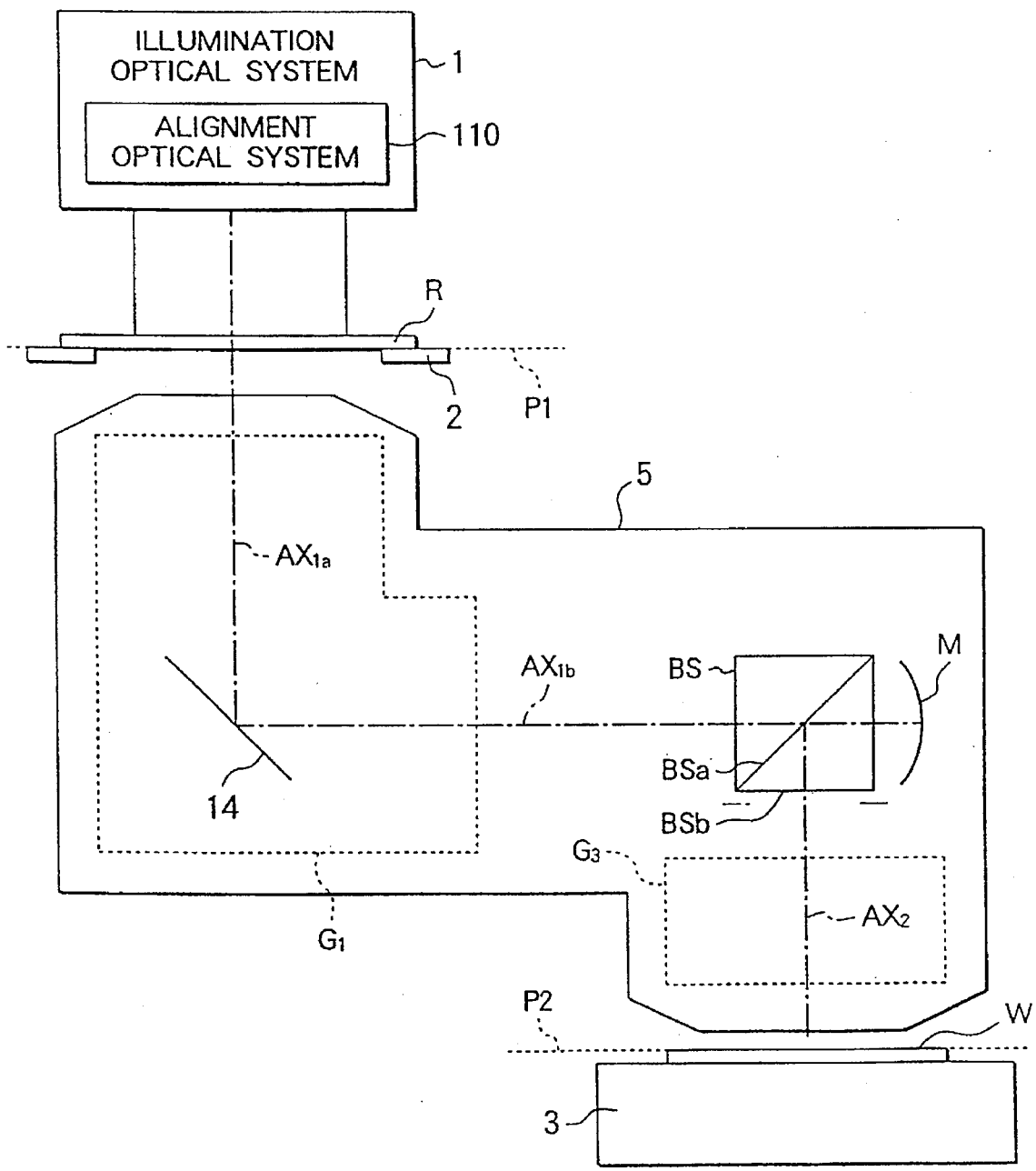
FIG. 11 is a view showing a modified example of the catadioptric optical system in accordance with the present invention in which the first surface P1 and the second surface P2 are disposed in parallel to each other.

Further, in the above-mentioned first to third embodiments (FIGS. 3, 7, and 9), a plane mirror may be disposed in an optical path of the optical system in order to bend the optical path. For example, when a plane mirror 14 is disposed in the first lens group $G_1$ as shown in FIG. 11, the reticle R (i.e., the object) and the wafer W (i.e., the image surface) can be disposed transversely in parallel to each other. This configuration is disclosed in detail in U.S. Pat. No. 5,402,267. In this drawing, AXi (i=1a, 1b, and 2) indicates the optical axes of the lens groups $G_1$ and $G_2$.

As explained in the foregoing, in accordance with the present invention, a large numerical aperture can be attained on the image side, a sufficient working distance can be secured on the image side, the size of the beam splitter can be reduced, and a resolution of a quarter micron unit can be attained.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 313354/1994 filed on Dec. 16, 1994 is hereby incorporated by reference.

What is claimed is:

1. A catadioptric optical system for forming a reduced image of a pattern of a first surface on a second surface, said catadioptric optical system comprising a first lens group, a beam splitter, a concave mirror having an enlarging magnification, and a second lens group;

wherein light from said first surface passes through said first lens group and said beam splitter, in this order, so as to be directed to said concave mirror, whereas light reflected by said concave mirror passes through said beam splitter and said second lens group, in this order, so as to be directed to said second surface;

wherein a rear-side principal point position of said second lens group is on said second surface side with respect to a light-entering surface of said second lens group on which the light having passed through said beam splitter is incident; and wherein said catadioptric optical system satisfies the following conditions:

$$-1<1/\beta_M<0.5$$

$$0.85<L_1/f_2$$

wherein $\beta_M$ is imaging magnification of said concave mirror, $L_1$ is distance between said rear-side principal point position and the light-entering surface of said second lens group, and $f_2$ is focal length of said second lens group.

2. A system according to claim 1, wherein said catadioptric optical system satisfies the following condition:

$$-1<\beta_2\beta<1$$

wherein $\beta_2$ is imaging magnification of said second lens group and $\beta$ is imaging magnification of said catadioptric optical system as a whole.

3. A system according to claim 2, wherein said beam splitter is a prism type beam splitter.

4. A system according to claim 3, further comprising an aperture stop disposed in an optical path between said beam splitter and said second surface, wherein said catadioptric optical system satisfies the following condition:

$$0.26<D_1/f_M<1.00$$

wherein $D_1$ is air-converted distance between said concave mirror and said aperture stop and $f_M$ is focal length of said concave mirror.

5. A system according to claim 4, wherein said catadioptric optical system satisfies the following condition:

$$D_2 \cdot NA/f_2 > 0.70$$

wherein $D_2$ is air-converted distance between an output surface of said beam splitter, which faces said second lens group and from which light whose traveling direction has been changed by a direction change surface within said beam splitter is output, and said second surface; NA is numerical aperture of said catadioptric optical system on said second surface side; and $f_2$ is focal length of said second lens group $G_2$.

6. A system according to claim 5, wherein said catadioptric optical system satisfies the following condition:

$$(\Phi_B^{1/2}-4d_W \cdot NA)/\{f_2 \cdot (NA)^2\}<4$$

wherein $\Phi_B$ is area of orthogonal projection of the direction change surface of said beam splitter on the output surface on said second lens group side, $d_W$ is working distance of said catadioptric optical system on said second surface side, NA is numerical aperture of said catadioptric optical system on said second surface side, and $f_2$ is focal length of said second lens group.

7. A system according to claim 5, wherein each of refractive elements constituting said first lens group is comprised of one of at least two different kinds of optical materials and each of refractive elements constituting said second lens group is composed of one of at least two different kinds of optical materials, said first lens group having at least a negative lens component of fluorite while said second lens group having at least a positive lens component of fluorite.

8. A system according to claim 1, wherein each refractive element of said first lens group is comprised of one of at least two different kinds of optical materials and each refractive element of said second lens group is comprised of one of at least two different kinds of optical materials, said first lens group having at least a negative lens component of fluorite while said second lens group having at least a positive lens component of fluorite.

9. A system according to claim 4, wherein said catadioptric optical system satisfies the following condition:

$$(\Phi_B{}^{1/2} - 4d_W \cdot NA)/\{f_2 \cdot (NA)^2\} < 4$$

wherein $\Phi_B$ is area of orthogonal projection of the direction change surface of said beam splitter on the output surface on said second lens group side, $d_W$ is working distance of said catadioptric optical system on said second surface side, NA is numerical aperture of said catadioptric optical system on said second surface side, and $f_2$ is focal length of said second lens group.

10. A catadioptric optical system for forming a reduced image of a pattern of a first surface on a second surface, said catadioptric optical system comprising a first lens group, a prism type beam splitter, a concave mirror having an enlarging magnification, and a second lens group;

wherein light from said first surface passes through said first lens group and said beam splitter, in this order, so as to be directed to said concave mirror, whereas light reflected by said concave mirror passes through said beam splitter and said second lens group, in this order, so as to be directed to said second surface; and wherein said catadioptric optical system satisfies the following conditions;

$$-1 < 1/\beta M < 0.5$$
$$0.85 < L_1/f_2$$

wherein $\beta_M$ is imaging magnification of said concave mirror, $L_1$ is distance between said rear-side principal point position and the light-entering surface of said Second lens group, and $f_2$ is focal length of said second lens group.

11. A system according to claim 10, wherein a rear-side principal point position of said second lens group is on said second surface side with respect to a light-entering surface of said second lens group on which the light having passed through said beam splitter is incident.

12. A system according to claim 11, wherein each refractive element of said first lens group is comprised of one of at least two different kinds of optical materials and each refractive element of said second lens group is comprised of one of at least two different kinds of optical materials, said first lens group having at least a negative lens component of fluorite while said second lens group having at least a positive lens component of fluorite.

13. A catadioptric optical system for forming a reduced image of a pattern of a first surface on a second surface, said catadioptric optical system comprising:

a beam splitter having a direction change surface for changing a traveling direction of light input from a predetermined direction;

a first lens group which is disposed in an optical path between said first surface and said beam splitter so as to guide light from said first surface to said beam splitter;

a second lens group which is disposed in an optical path between said beam splitter and said second surface so as to guide light from said beam splitter to said second surface; and a collimator for collimating light which has passed through said first lens group and whose traveling direction is to be changed by the direction change surface of said beam splitter and guiding thus collimated light to said beam splitter from said predetermined direction, wherein said collimator includes a concave mirror having an enlarging magnification.

14. A system according to claim 13, where in a rear-side principal plane of said second lens group is on said second surface side with respect to a light-entering surface of said second lens group on which the light having passed through said beam splitter is incident.

15. A system according to claim 14, wherein said catadioptric optical system satisfies the following conditions:

$$-1 < 1/\beta_M < 0.5$$
$$0.85 < L_1/f_2$$

wherein $\beta_M$ is imaging magnification of said concave mirror, $L_1$ is distance between said rear-side principal plane and the light-entering surface of said second lens group, and $f_2$ is focal length of said second lens group.

16. A system according to claim 13, wherein said beam splitter is a prism type beam splitter.

17. An exposure apparatus comprising:

a first stage allowing a photosensitive substrate to be held on a main surface thereof;

a second stage for holding a mask having a predetermined pattern;

an illumination optical system for illuminating said mask with exposure light having a predetermined wavelength so as to transfer an image of the pattern of said mask to said substrate; and a catadioptric optical system provided between said first stage and said second stage so as to project a reduced image of the pattern on said mask upon said substrate, said catadioptric optical system comprising:

a beam splitter having a direction change surface for changing a traveling direction of light input from a predetermined direction;

a first lens group which is disposed in an optical path between said mask and said beam splitter so as to guide light from said mask to said beam splitter;

a second lens group which is disposed in an optical path between said beam splitter and said substrate so as to guide light from said beam splitter to said substrate; and a collimator for collimating light which has passed through said first lens group and whose traveling direction is to be changed by the direction change surface of said beam splitter and guiding thus collimated light to said beam splitter from said predetermined direction, wherein said collimator of said catadioptric optical system includes a concave mirror having an enlarging magnification.

18. An apparatus according to claim 17, wherein, in said catadioptric optical system, a rear-side principal plane of said second lens group is on said first stage side with respect to a light-entering surface of said second lens group on which the light having passed through said beam splitter is incident.

19. An apparatus according to claim 18, wherein said catadioptric optical system satisfies the following conditions:

$$-1 < 1/\beta_M < 0.5$$

$$0.85 < L_1/f_2$$

wherein $\beta_M$ is imaging magnification of said concave mirror, $L_1$ is distance between said rear-side principal plane and the light-entering surface of said second lens group, and $f_2$ is focal length of said second lens group.

20. An apparatus according to claim 17, wherein said beam splitter of said catadioptric optical system is a prism type beam splitter.

21. An exposure apparatus comprising:

a first stage allowing a photosensitive substrate to be held on a main surface thereof;

a second stage for holding a mask having a predetermined pattern;

an illumination optical system for illuminating said mask with exposure light having a predetermined wavelength so as to transfer an image of the pattern of said mask to said substrate; and a catadioptric optical system provided between said first stage and said second stage so as to project a reduced image of the pattern on said mask upon said substrate, said catadioptric optical system comprising:

a beam splitter having a direction change surface for changing a traveling direction of light input from a predetermined direction;

a first lens group which is disposed in an optical path between said mask and said beam splitter so as to guide light from said first surface to said beam splitter;

a second lens group which is disposed in an optical path between said beam splitter and said substrate so as to guide light from said beam splitter to said substrate; and a concave mirror for reflecting light which has passed through said first lens group and whose traveling direction is to be changed by the direction change surface of said beam splitter and guiding thus reflected light to said beam splitter from said predetermined direction, wherein said catadioptric optical system satisfies the following conditions:

$$-1 < 1/\beta_M < 0.5$$

$$0.85 < L_1/f_2$$

wherein $\beta_M$ is imaging magnification of said concave mirror, $L_1$ is distance between said rear-side principal plane and the light-entering surface of said second lens group, and $f_2$ is focal length of said second lens group.

22. An apparatus according to claim 17, wherein, in said catadioptric optical system, a rear-side principal plane of said second lens group is on said first stage side with respect to a light-entering surface of said second lens group on which the light having passed through said beam splitter is incident.

23. A method for fabricating at least semiconductor devices or liquid crystal display devices by using a projection optical system according to claim 10, comprising the steps of:

illuminating a mask prepared as said first object with light of a predetermined wavelength, said mask being formed a predetermined pattern thereon; and projecting an image of the pattern on said mask onto a photosensitive substrate prepared as said second object through said projection optical system, thereby performing an exposure process.

24. A method according to claim 23, wherein, in said catadioptric optical system, a rear-side principal plane of said second lens group is on said first stage side with respect to a light-entering surface of said second lens group on which the light having passed through said beam splitter is incident.

* * * * *